(12) United States Patent
Darwish

(10) Patent No.: US 11,264,980 B1
(45) Date of Patent: Mar. 1, 2022

(54) POWER COMBINING CIRCUITS USING TIME FOLDING

(71) Applicant: U.S. Army Combat Capabilities Development Command, Army Research Laboratory, Adelphi, MD (US)

(72) Inventor: Ali Darwish, Highland, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 17/189,864

(22) Filed: Mar. 2, 2021

(51) Int. Cl.
*H03K 5/06* (2006.01)
*H03K 12/00* (2006.01)
*H02M 7/537* (2006.01)
*H03K 5/26* (2006.01)

(52) U.S. Cl.
CPC ............ *H03K 12/00* (2013.01); *H02M 7/537* (2013.01); *H03K 5/06* (2013.01); *H03K 5/26* (2013.01)

(58) Field of Classification Search
CPC .................................. H03K 5/06; H03K 12/00
USPC .......................... 327/291, 293, 294, 355, 361
See application file for complete search history.

(56) References Cited

U.S. PATENT DOCUMENTS

| | | | | |
|---|---|---|---|---|
| 4,472,691 A | * | 9/1984 | Kumar | ...................... H01P 5/12 327/434 |
| 6,121,853 A | * | 9/2000 | London | ...................... H01P 5/12 333/125 |
| 9,000,865 B2 | | 4/2015 | Darwish et al. | |
| 9,362,602 B2 | | 6/2016 | Darwish et al. | |
| 2011/0260771 A1 | * | 10/2011 | Hirota | ...................... H03F 3/211 327/360 |

OTHER PUBLICATIONS

C. Kai and S. Cheng, "Millimeter-Wave Power-Combining Techniques," Microwave Theory and Techniques, IEEE Transactions on, vol. 31, pp. 91-107, 1983.
K. J. Russell, "Microwave Power Combining Techniques," Microwave Theory and Techniques, IEEE Transactions on, vol. 27, pp. 472-478, 1979.

(Continued)

*Primary Examiner* — William Hernandez
(74) *Attorney, Agent, or Firm* — Eric B. Compton

(57) ABSTRACT

Time folding power combining circuits convert a continuous wave into a pulsed wave of greater peak power. Such a circuit may comprise: a switch which receives a continuous wave signal as input, and outputs first and second pulsed wave signals along first and second signal paths, respectively, said switch being configured to repeatedly switch connection back and forth between the input and the outputs of the first and second signal paths in a plurality of time frames; a delay line in the second signal path configured to introduce a time delay to the second pulsed wave signal in the second signal path such that the first pulsed wave signal in the first signal path and the time-delayed second pulsed wave signal in the second signal path substantially align in the same time frames; and a combiner, which receives the first pulsed wave signal in the first signal path and the time-delayed pulsed second wave signal in the second signal path as inputs, and combines them into a single combined pulsed wave signal as output.

20 Claims, 10 Drawing Sheets

(56) References Cited

OTHER PUBLICATIONS

S. F. Marsh, "MMIC power splitting and combining techniques," in Design of RFIC's and MMIC's (Ref. No. 1997/391), EE Tutorial Colloquium on, 1997, pp. 6/1-6/7.

R. A. York and Z. B. Popovic, "Active and quasi-optical arrays for solid-state power combining," Wiley, 1997, Description only.

R T. N. D. du Toit, J.H. Smith, F N Schirk and J.A Mogel, "Design of Solid-state, Wideband, High-power Microwave Amplifiers for Radiated Immunity Testing," Microwave Journal, vol. 53, pp. 90-100, Jul. 11, 2010.

M. Cicolani and A. Panariello, "Novel Design Technique for Radial Power Combiners," in Microwave Conference, 2000. 30th European, 2000, pp. 1-4.

M. A. Gouker, "A circuit-fed, tile-approach configuration for millimeter-wave spatial power combining," in Microwave and Optoelectronics Conference, 1999. SBMO/IEEE MTT-S, APS and LEOS—IMOC '99. International, 1999, pp. 231-232.

M. A. Gouker, J. T. Delisle, and S. M. Duffy, "A circuit-fed tile-approach configuration for millimeter-wave spatial power combining," Microwave Theory and Techniques, IEEE Transactions on, vol. 50, pp. 17-21, 2002.

S. C. Ortiz, J. Hubert, L. Mirth, E. Schlecht, and A. Mortazawi, "A high-power Ka-band quasi-optical amplifier array," Microwave Theory and Techniques, IEEE Transactions on, vol. 50, pp. 487-494, 2002.

Wikipedia's "RF switch" page, available at https://en.wikipedia.org/wiki/RF_switch (accessed Mar. 1, 2021).

Fairview Microwave's product literature for 2-Way and 4-Way RF Power Combiners up to 6 GHz, available at: https://www.fairviewmicrowave.com/rf-products/power-combiners.html (accessed Mar. 1, 2021).

Mini-Circuits' product literature for the ZX10-2-12+ Coaxial Power Splitter/Combiner, available at: https://www.minicircuits com/pdfs/ZX10-2-12+.pdf (accessed Feb. 9, 2021).

Analog Device Inc.'s product literature for the model HMC574A switch, available at: https://www.analog.com/media/en/technical-documentation/data-sheets/hmc574A.pdf (accessed Feb. 1, 2021).

\* cited by examiner

POWER COMBINING CIRCUITS USING TIME FOLDING

GOVERNMENTAL INTEREST

The invention described herein may be manufactured, used and licensed by or for the U.S. Government.

BACKGROUND

Field

The field of the invention relates to power signal combining, and more particularly to, power combining circuit using time folding.

Description of Related Art

In radio frequency (RF) system and amplifier design, there is a trade-off between output power, efficiency, and heat. Even with highly efficient amplifiers, at high output powers, a considerable percentage of the input DC power is converted to heat. The added heat can degrade device performance as well as increases the cooling requirements of many RF systems, leading to increased costs and power consumption just to keep a device within its operating temperature.

Despite this difficulty, many RF applications require the use of high-power RF transmitters. This need has led to years of research and development into various methods of RF power combing to maximize the output power from many individual devices. The most straight forward method of power combination is a corporate power combining architecture. Corporate combining makes use of many identical 2-way power combiners and cascades $2^i$ combiners. The notable drawback, however, is that the loss per combiner adds up quickly as the number of combiners increase.

Another popular method of power combing is chain-coupled power combing. This method couples the power from individual devices into a transmission line via directional couplers. Chain-coupling suffers from two major drawbacks: design complexity and coupler bandwidth.

Radial power combining was developed to elevate some of the issues with corporate and chain power combining. Radial combiners combine the power of many devices in a single stage which reduces the losses as compared to cooperate combiners and has much better bandwidth as compared to chain-coupled combiners. The trade-off is that radial combiners tend to be very large and bulky, which limits their use.

Spatial power combining is another common technique used to combine the output power of multiple devices. Spatial power combining relies on exciting a number of devices through free space which means the combining efficiency is independent of the number of combined devices. The major drawback to spatial power combination is that the output power is a traveling wave in free space, and requires an antenna to couple the power back onto a planar circuit.

While many of the prior explored techniques are able to produce large output powers, none are able to produce a peak output power greater than that of the input.

SUMMARY

Embodiments of the present invention provide time folding power combining circuits. These circuits are configured to convert a continuous wave signal into a pulsed wave signal by time folding.

According to an embodiment, a time folding power combining circuit comprises: a switch which receives a continuous wave signal as input, and outputs first and second pulsed wave signals along first and second signal paths, respectively, said switch being configured to repeatedly switch connection back and forth between the input and the outputs of the first and second signal paths in a plurality of time frames; a delay line in the second signal path configured to introduce a time delay to the second pulsed wave signal in the second signal path such that the first pulsed wave signal in the first signal path and the time-delayed second pulsed wave signal in the second signal path substantially align in the same time frames; and a combiner, which receives the first pulsed wave signal in the first signal path and the time-delayed pulsed second wave signal in the second signal path as inputs, and combines them into a single combined pulsed wave signal as output.

In some implementations/embodiments, the circuit may further comprise a phase adjuster provide in one or more the signal paths to adjust the phase of the first pulsed wave signal and/or the time-delayed second pulsed wave signal. The switch may comprise a single pole double throw (SPDT) switch, as a non-limiting example. To operate, the switch can also receive a control signal for causing it to switch the connection back and forth. The circuit may further comprise a control signal generator configured to generate the control signal. The control signal can be a square wave signal. It may have a frequency between about 10 to 1,000 MHz.

Additionally, the circuit may further comprise a continuous wave generator configured to produce the continuous wave signal. The continuous wave signal may have a frequency between about 1-10,000 MHz. Ideally, the peak power of the single combined pulsed wave signal output is approximately twice that of the continuous wave signal input.

According to another embodiment, a time folding power combining circuit comprises: a 1-to-N switch which receives a continuous wave signal as its input, and outputs N pulsed wave signals along a first signal path and N−1 signal paths, respectively, said switch being configured to repeatedly switch connection back and forth between the input and the output of the first signal paths and the N−1 signal paths in a plurality of time frames; a plurality of delay lines, wherein one delay line is provided in each of the N−1 signal paths configured to introduce a time delay to pulsed wave signals in the given N−1 signal paths such that the first pulsed wave signal in the first signal path and each of the N−1 time-delayed pulsed wave signals in the N−1 signal paths substantially align in the time frames; and a N-to-1 combiner, which receives the first pulsed wave signal in the first signal path and the N−1 time-delayed pulsed wave signals in the N−1 signal paths as inputs, and combines them into a single combined pulsed wave signal as output. N is an integer greater than or equal to 2.

The delay lines in the N−1 signal lines sequentially add a lesser amount of time delay to the pulsed signals in those lines. The delay lines may comprise coaxial cables. For packaging and/or providing compactness, each delay line in the N−1 signal paths may be bent, spooled, coiled, bundled, and/or wrapped, one or more times, between its beginning and end.

The circuit may further comprise a phase adjuster provide in one or more the signal paths to adjust the phase of the first pulsed wave signal and/or the time-delayed second pulsed wave signal. Also, the circuit may further comprise a signal source which generates the continuous wave signal. Ideally, the peak power of the single combined pulsed wave signal output is approximately N times that of the continuous wave signal input.

According to yet another embodiment, a cascading circuit of time folding power combining circuits comprise: at least a first-time folding power combining circuit and second-time folding power combining circuit, each according to aforementioned circuit embodiment, connected in series with the output of the first time folding power combining circuit being the input to the second time folding power combining circuit. Here, ideally, the peak power of the single combined pulsed wave signal output is approximately M×N times that of the continuous wave signal input, wherein M is the number of cascaded time folding power combining circuits and N is number of lines of each time folding power combining circuit.

These and other embodiments of the invention are described in more detail, below.

DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only illustrative embodiments of this invention and are therefore not to be considered limiting of its scope, for the invention may admit to other equally effective embodiments.

Figure 1:
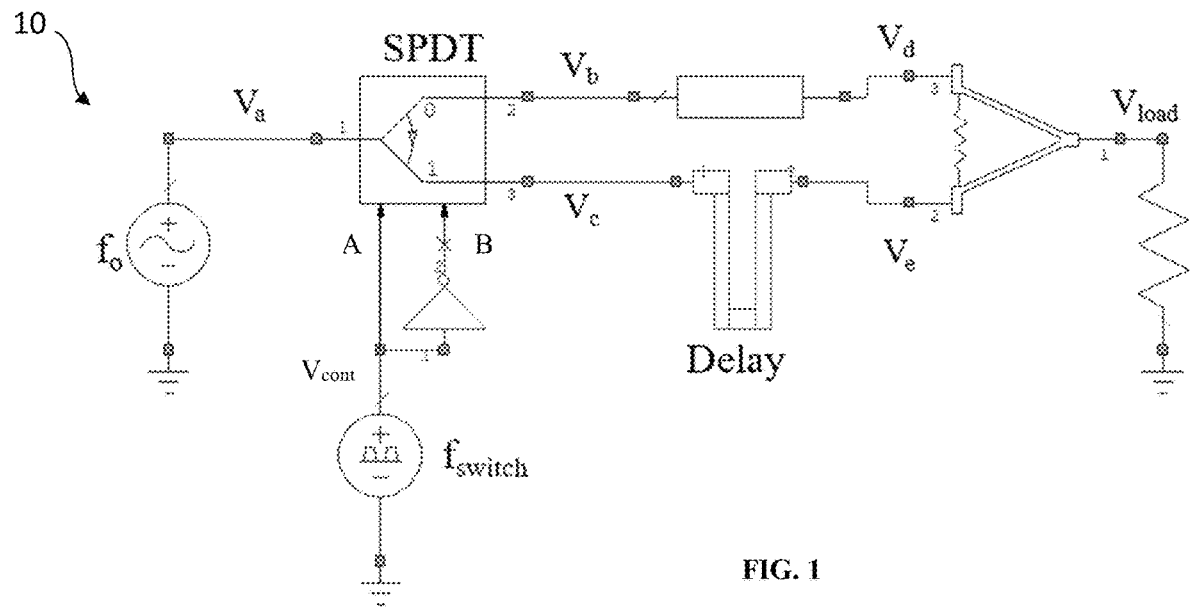
FIG. 1 is a schematic of a time folding power combining circuit according to an embodiment.

To facilitate understanding, identical reference numerals have been used, where possible, to designate comparable elements that are common to the figures. The figures are not drawn to scale and may be simplified for clarity. It is contemplated that elements and features of one embodiment may be beneficially incorporated in other embodiments without further recitation.

DETAILED DESCRIPTION

Novel power combining circuits achieve peak power combining through time folding. As used herein, "time folding" refers to the process of segmenting a continuous repeating signal into a plurality of time slots, aligning the time slots for the segmented signals, and then combining them. The segmented signals are pulsed signals. Combining the time-aligned segmented signals, produces a pulsed signal with an increased peaked power. For instance, assuming an original continuous wave signal is split into two time segments, 50% duty-cycle signals, the output is a pulse signal with twice the peak power.

Utilizing the time folding technique lowers the output power specification requirement for RF amplifiers allowing designers to use lower power, lower cost, and more efficient amplifiers in pulsed RF systems. Thus, the technology allows designers to use lower power circuitry in their designs thereby saving cost and space. This technology may also be advantageous for radar and other systems which rely upon pulsed signals.

FIG. 1 shows the diagram for one-time folding power combining circuit 10 according to an embodiment. The circuit 10 relies functions as a continuous wave (CW) amplifier to create a pulsed output signal with about twice the peak power.

Figure 2:
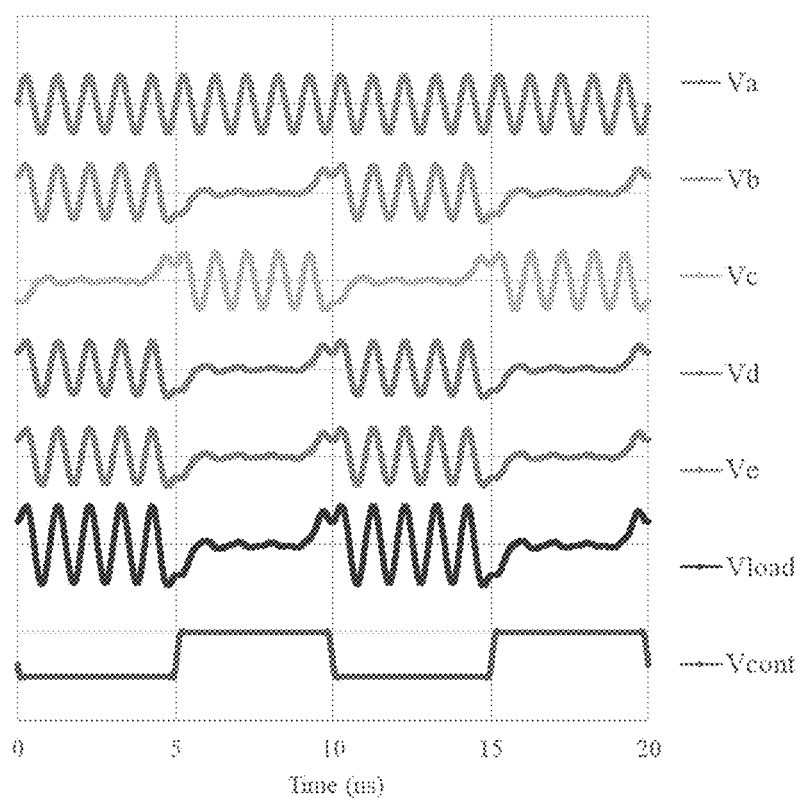
FIG. 2 is a plot showing time domain waveforms at various points plotted at various point nodes within the circuit of FIG. 1.

The circuit 10 is comprised of an input line, a switch, two signal paths, a delay line to introduce delay in the second signal path, and a power combiner. It also includes switch control means (controller). The switch selectively connects the input line to one of the multiple signal lines at any one time as an output. The power combiner combines the signals on the multiple signal lines. FIG. 2 is a plot showing the time domain waveforms at various points or nodes of the circuit 10 of FIG. 1.

An input signal $V_a$ is fed into along the input line to the switch. It may be a continuous wave (CW). For instance, the input signal $V_a$ may be any periodic, repeating electrical signal, like a sinusoidal wave. It may have a frequency of about 1-10,000 MHz typical for many RF applications (although, wave of other frequencies are certainly contemplated for other applications). As one non-limiting example, shown in the top of the plot of FIG. 2, the input signal $V_a$ may be an ordinary sine wave with the fundamental frequency $f_o$=1 GHz, say, is fed into a switch.

The switch may be, for instance, a single pole double throw (SPDT), multiple throw (SPnT) switch, bypass switch (such as a 4-port bypass switch), or any other switch which allows a single input to multiple (two or more) output paths.

In circuit 10, the switch is a single-pole double throw (SPDT) switch. A single-pole double throw (SPDT) switch or 1-to-2 SPDT switch is a type of switch comprised of a group of transistors that are configured so that one can (through a control signal) decide where to direct the input signal. A variety of SPDT switches are commercially-available. One exemplary commercial SPDT switch which may be used in embodiments is the model HMC574A switch available from Analog Device Inc.

Essentially, the 1-to-2 SPDT is a switch with one input, and two possible outputs. The SPDT switch position is controlled via a control voltage $V_{cont}$. The control voltage $V_{cont}$ for the SPDT switch may be a square pulse train which controls the switching at frequency $f_{switch}$. An example is shown at the bottom of the plot of FIG. 2 for $f_{switch}$=100 MHz which sets the switching period $T_{switch}$ to 10 ns (1/$f_{switch}$); each time frame is 5 ns.

Basically, the input continuous wave (CW) input signal $V_a$ is split by the SPDT switch into two signal streams $V_b$ and $V_c$ each occupying a particular time slot. The SPDT switch is controlled to go back and forth between two switch positions 0, 1. At switch position 0, the switch connects the input node 1 to output node 2, and the first signal stream $V_b$ is essentially the input signal $V_a$, whereas the second signal stream $V_c$ is essentially nil. In switch position 1, it connects input node 1 to output node 3, and the second signal stream $V_c$ is essentially the input signal $V_a$, and the first signal stream $V_b$ is essentially nil.

The time duration that the switch is at position 0, and then position 1, before it goes back to position 0 is known at the switch period $T_{switch}$. The switch period $T_{switch}$ is determined by the frequency of the switching of the cycle $f_{switch}$ where $T_{switch}$=1/$f_{switch}$. This represents one duty cycle for the 2-to-1 switch. The first half of the switch period $T_{switch}$ the switch is at position 0 and the second half of the switch period $T_{switch}$ it is at position 1. This forms a plurality of time frames, each with a duration of $T_{switch}$/2.

The control signal decides which output the signal will go to. One control line goes to the switch which toggles the signal between the two outputs. The control signal $V_{cont}$ of the SPDT switch sets two voltages A and B used by the switch. To direct the input signal to output 1, A is set to high (e.g., 1 V), and B is set to low (e.g., −1 V). And to direct the input to output 2, A is set to low (−1 V), and B is set to high (1V). A and B are always opposites of each other. The split in the control lines is essentially meant to indicate that one goes to A, and the other goes to B. In the B signal line, there is a NOT-gate which simply flips 1 to −1, and vice versa.

Because of the switching, the first and second signal stream $V_b$ and $V_c$ are not aligned with one another in the time. In a given time frame, for instance, when $V_b$ corresponds to the input signal $V_a$, $V_c$ is nil or zero. In the subsequent time frame, the opposite occurs. This is quite evident comparing the waveforms of $V_a$ and $V_c$ in the plot of FIG. 2.

The goal of the circuit is to combine the two signal streams at the combiner to produce the final pulsed output. Here, the combiner is a 2-to-1 combiner which combines two signals. In A variety of power combiners are commercially-available. One exemplary commercial combiner that may be used in embodiment is the Mini-Circuits' model ZX10-2-12+ power combiner.

To get the maximum output, the two signal streams should be aligned before they are combined. The alignment aims to achieve two objectives. The first objective, time slot alignment, is to have the signals $V_b$ and $V_c$ in the same time frame or slot in preparation for their addition. The second objective, phase alignment, is to have them in phase in order to add them constructively. The alignment may be characterized as follows:

$$\text{Alignment} = \text{Time slot alignment} \pm \text{phase difference alignment} \quad (1)$$

The first objective is a true time delay while the second objective is a phase shift (which may or may not be a true time delay). The second objective may be optional in some implementations/embodiments.

The time slot alignment delays one of the signals relative to the other so that they are in the same frame. For the example in plot of FIG. 2, the time frame duration is 5 ns. If we delay one of the two signal streams by that amount of time, the two signal streams with be in same frame. In other words, both the signal streams are signal or nil in each frame. This delay, though, may cause phase shift between the two signals in each frame. The phases of the signals may also be needed to be adjusted in some cases.

In the circuit 10 depicted in FIG. 1, a time delay is initially introduced in the second signal steam path which affect the second signal stream. The delay line is provided between $V_c$ and $V_e$ for this purpose here (although, the particular line which the delay line is included may be reversed from what is depicted here to provide the same results in other configurations). The rectangular box between $V_b$ and $V_d$ is a short transmission line of length $x_0$. The delay line (between $V_c$ and $V_e$) is essentially a much longer transmission line of length $x_1$. The short transmission line and the longer delay lines may be any conductor, wire, trace, a cable, or any other electrically conductive waveguiding structure suitable for the low loss signal transmission. They preferably will be identical in type and only differing in their length. In one non-limiting example, they may be standard coaxial cables (similar to the ones that connects a TV-antenna to the TV).

The delay line between $V_c$ and $V_e$ is configured to introduce a delay in the second signal so as to align the time frame of the first and second signals streams. In a transmission line, the length of the line x relates to the time $T_{delay\ line}$ it takes the wave to travel length x traveling at speed v. The governing equation is given is as follows:

$$x = v \times T_{delay\ line} \quad (2)$$

For a typical coaxial cable, v is approximately $2 \times 10^8$ m/s. Setting $T_{delay\ line}$ to be the time frame duration to be aligned, one can easily compute the length of the delay line x to provide that delay in time. Note, the time frame duration is $T_{delay\ line}$ (=$T_{switch}$/2).

The transmission line between $V_b$ and $V_d$, is typically much shorter in length than the delay line between $V_c$ and $V_e$, in other words, $x_1 \gg x_0$. Thus, the length of the transmission line between $V_b$ and $V_d$ is typically ignored; and the short transmission line is assumed to have a very negligible or zero delay such that $V_b$ and $V_d$ are assumed to be the same. If $x_0$ is not negligible, then one should take the relative differences of lengths of the two signal lines into account in computing the delay length, where $x = x_1 - x_0$.

In the plot of FIG. 2, the time frames are 5 ns in duration. Solving the aforementioned equation (2): $x = (2 \times 10^8$ m/s$) \times (5 \times 10^{-9})$ = 1 m. Thus, a coaxial line which is 1 m in length will cause a time delay of 5 ns for an electrical signal to propagate its length. In the second signal stream, signal $V_e$ is time delayed from $V_c$ using the delay line by 5 ns, in order to 'fold' it back in the same time slot as $V_d$ in the first signal stream. Looking at the time domain signals $V_d$ and $V_e$ in that plot, it can be seen that using the delay line, the two signals stream are now aligned in their time frames.

The longer delay line will introduce a phase delay PHI which is related to the time delay $T_{delay\ line}$ as follows (in radians):

$$PHI = 2\pi \times f \times T_{delay\ line}, \quad (3)$$

where f is the frequency of the signal wave, and $\pi$ is Pi or approximately 3.14159.

Rearranging equation (3) for solving $T_{delay\ line}$ yields the following equation:

$$T_{delay\ line} = PHI/2\pi f \quad (3a)$$

Combining Equations (2) and (3a), yields the following equation for calculating the length of the transmission line x to compensate for a given phase PHI delay between signals (in radians):

$$x = v \times PHI/2\pi f \quad (4)$$

Since the signal portions of the first and second signal streams in the frames are periodic and have the same period, the number of periods between them is not so important; rather it is the phase difference which is. The phase difference $\Delta\varphi$ can be easily determined using the modulo (mod) function as follows:

$$\Delta\phi = PHI \bmod 2\pi \qquad (5)$$

As an example, for the aforementioned 1 m coaxial delay line carrying a signal wave with a frequency f=1 GHz, delayed 5 ns, the delay line will introduce a phase delay PHI of approximately 31.4159 radians to the second signal stream compared with the first signal stream. This happens to be exactly 5 periods of the first signal stream. Thus, there is no phase difference.

One or more phase shifters/adjuster can optionally be included in one of the signal lines (between $V_b$ and $V_d$ or between $V_c$ and $V_e$) of the circuit to perform any phase difference alignment if desired. The phase difference should be kept small (ideally zero or at least within a few degrees of each other) to ensure that the two signals add constructively. An example of adding phase shifters for providing phase adjustments to signals in the circuit is later discussed with respect to the circuit in FIG. 8.

After performing time slot alignment and any phase difference alignment, the first and second signal streams are added (with a power combiner) to produce a larger signal, $V_{load}$, which effectively doubles the peak power. The signal streams simply sum by the power combiner such that $P_{load}=P_d+P_e$; where $P_{load}$, $P_d$, and $P_e$ are the powers in signal load, d, and e, respectively.

This process can be repeated to shorten the pulse and produce greater peak power in some circuit embodiments. This is further discussed below with respect to cascaded embodiments.

Figure 3:
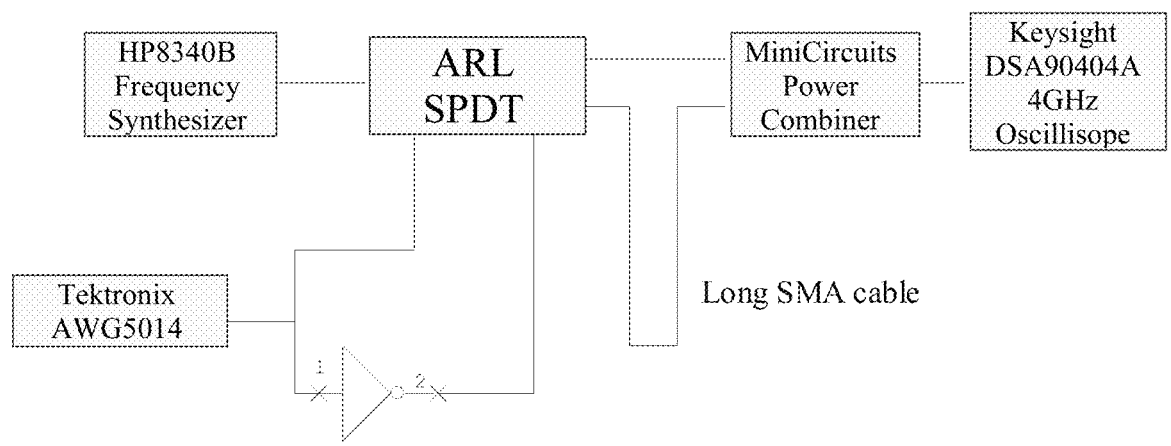
FIG. 3 shows a hardware schematic for a time folding power combining circuit according to an embodiment built and tested by the inventor.

FIG. 3 shows a hardware schematic for a time folding power combining circuit built and tested by the inventor. The actual circuit was formed on a printed circuit board (PCB). This circuit can be used to combine power over frequencies between 1-10,000 MHz. The results demonstrate that the output peak power is boosted, by up to 2.5 dB, compared with the input power.

A Hewlett Packard HP8340B frequency synthesizer was used to create the fundamental tone $f_o$ which will ultimately be combined to produce a larger pulsed output power signal. The SPDT switch is a GaN Monolithic microwave integrated circuit (MMIC) designed at the U.S. Army CCDC Army Research Laboratory in Adelphi, Md. It can be switched at high speeds; no large capacitors, resistors, or inductors are included in the gate control line. The delay line was a conventional coaxial cable with SMA (SubMiniature version A) connectors. It had a length of about 4.4 m. The switching time constant $\tau$ should be much smaller than the switch period $T_{switch}$ to avoid loss of power (when the switch is in transition from one state to another); say $\tau < T_{switch}/100$. The SPDT switch was die mounted to the PCB. A Tektronix Arbitrary Waveform Generator (AWG) is used to produce the square control signal (at $f_{switch}$) for the SPTD switch.

After passing through the line and delay line, the two signal paths are aligned in both time and phase. A Mini-Circuits' model ZX10-2-12+ power combiner is used to combine to the two signals to produce the final pulsed output. A Keysight DSA90404A 4 GHz oscilloscope was used to measure the time domain waveforms at different nodes and calculate the CW input power as well as the pulsed output power. The power was also verified with an Agilent RF power meter (not depicted).

Figure 4:
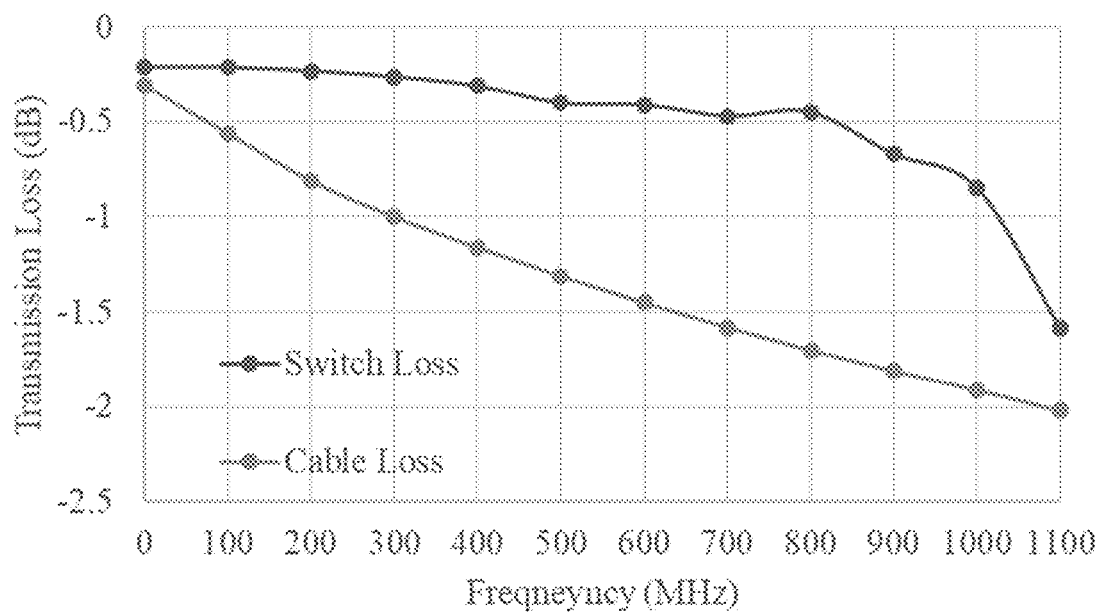
FIG. 4 is a plot showing the loss of the SPDT switch and SMA cable used to create the delay line for the circuit in FIG. 3.

FIG. 4 is a plot showing the loss of the SPDT switch and coaxial cable as a function of frequency (with static DC control voltages) for the circuit in FIG. 3. The HP8340B synthesizer is used to create the fundamental tone $f_o$ which will ultimately be combined to produce a larger pulsed output power signal. The delay line was a generic SMA cable with a group delay of ~22 ns; hence an appropriate $T_{switch}$ is ~44 ns, and $f_{switch} \approx 23$ MHz.

Figure 5:
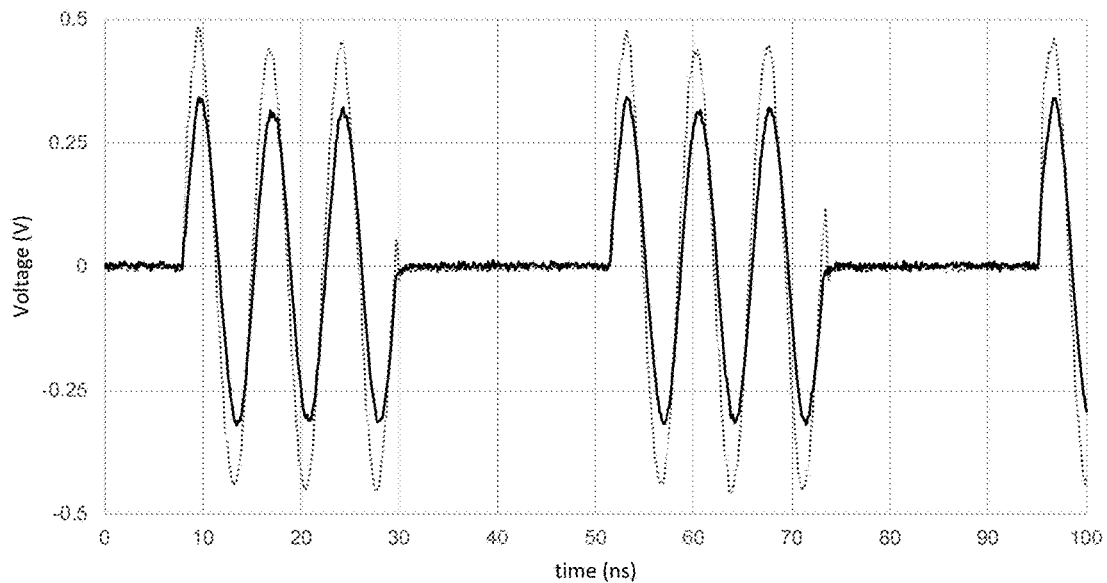
FIG. 5 is a plot of time domain signals for the circuit built in FIG. 3.

The measured data of the circuit of FIG. 3 is shown in FIG. 5. It shows the time domain voltage waveforms seen at $V_e$ (before being combined) and the combined signal's voltage $V_{load}$ where $f_o=138$ MHz, and $f_{switch}=23$ MHz. The input signal was around 0.8 dBm; hence the peak-to-peak (pp) input voltage, $V_{a,pp}=694$ mV. The delayed signal $V_{e,pp}$ was 640 mV, and the combined signal, $V_{load}$ was 900 mV; equivalent to an average power of 0.05 dBm. The measured attenuation, in average power, was 0.75 dB; additionally verified using the Agilent power meter. Given that the input is a CW signal while the output is a 50% duty cycle signal, the peak output power is 3.05 dBm. That represents a 2.25 dB increase in peak power, compared with the input CW signal.

Figure 6:
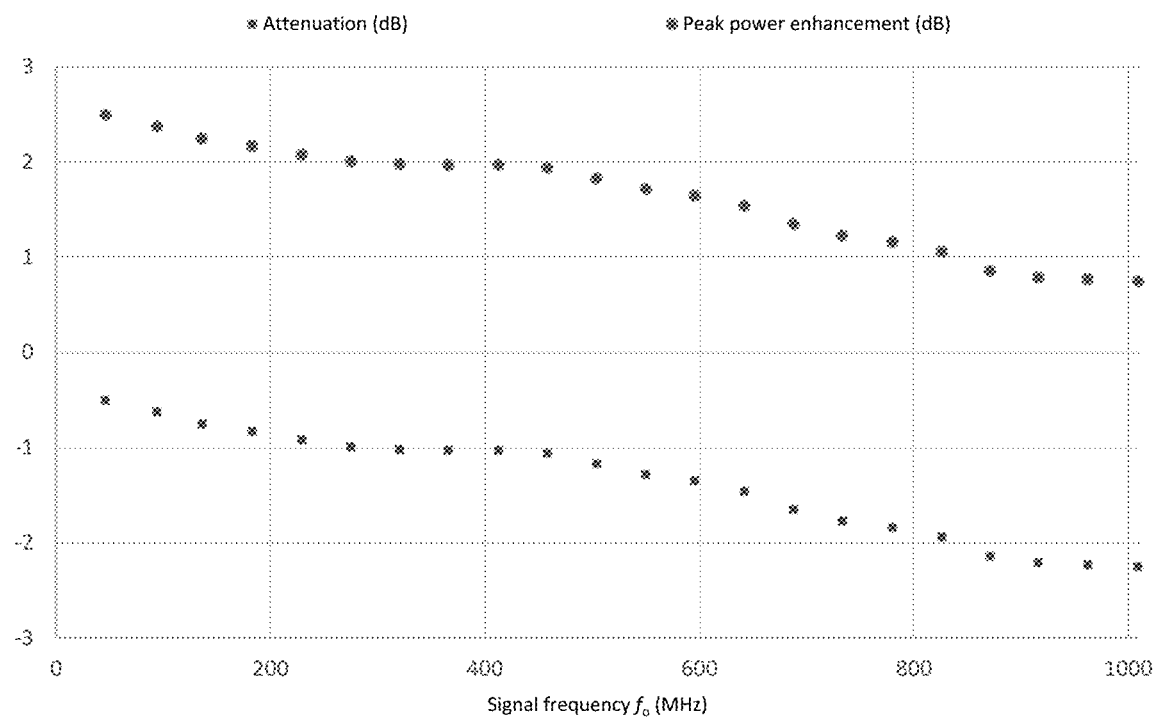
FIG. 6 is a plot of attenuation in average power, and the corresponding boost in peak power, versus signal frequency the circuit in FIG. 3.

The same circuit was used with varying signal frequencies $f_o$. FIG. 6 shows the attenuation, in dB, versus frequency $f_o$ for the circuit in FIG. 3. Again, one can calculate the enhancement to peak power by adding 3 dB to the attenuation; to account for the 50% duty cycle of the output signal. The enhancement to peak power is plotted. As expected, the switch and delay line losses increase with increasing $f_o$; see FIG. 4. However, there are many enhancements that can be implemented to reduce the attenuation. For example, a lower loss SMA delay line can be used. Additionally, one could use a higher $f_{switch}$ frequency which would require a shorter delay line.

Figure 7:
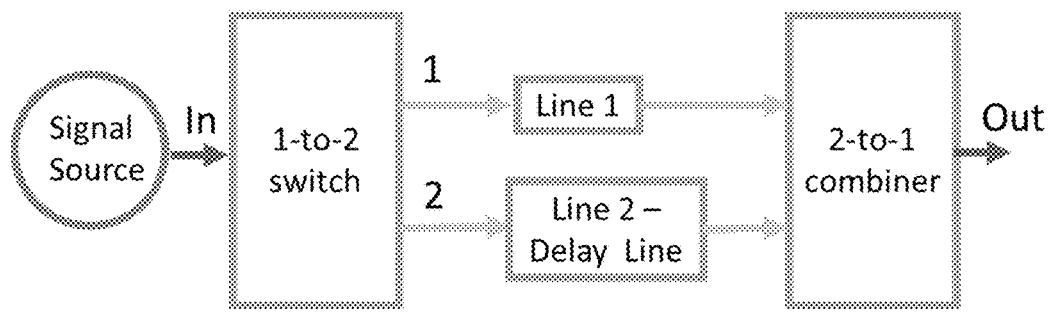
FIG. 7 shows a simplified schematic of a time folding power combining circuit splitting and adding pulsed signals in two signal paths according to an embodiment.

FIG. 7 shows a simplified schematic of a time folding power combining circuit splitting and adding pulsed signals in two signal paths according to an embodiment. It depicts the signal source, input line, the 2-to-1 switch, two output paths, 1A, 2A, from the switch, two transmission lines, Line 1 and Line 2, the latter configured as a delay line introduce into the second signal line, and the 1-to-2 power combiner. The 1-to-2 switch divides an input CW signal, with an average power $P_{avg}$, into two signals in two paths 1A and 1B, respectively. As a result, the output of the 2-to-1 combiner will be a pulse with duty cycle ½ and peak power equal to $2 \times P_{avg}$, assuming all components are lossless. The schematic omits showing the switch control means for simplicity. In some instances, it may be equivalent to the circuit of FIG. 1. The signal source may not be a part of circuit in some implementations/embodiments.

Figure 8:
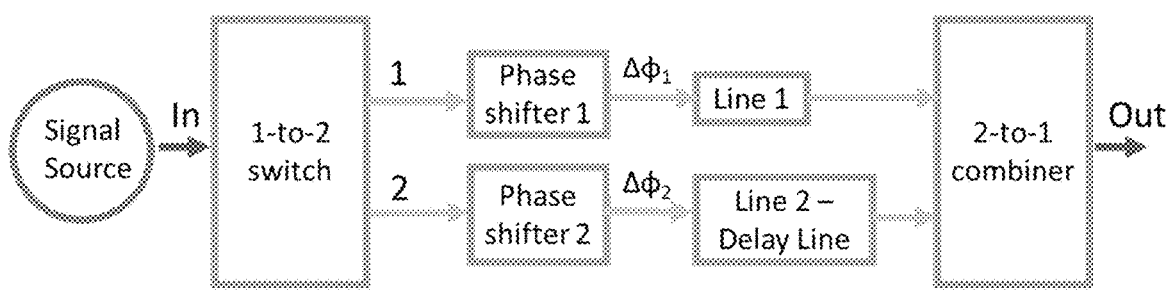
FIG. 8 shows simple schematic of a time folding power combining circuit further including phase shifters according to an embodiment.

FIG. 8 shows simple schematic of a time folding power combining circuit further included phase shifters according to an embodiment. This circuit is similar to that in FIG. 7, but further includes phase shifters in the discrete paths of the transmission lines. Lines 1 to Line 2 are the transmission lines. While the phase shifters are shown as coming before the transmission lines, Lines 1 and Line 2, in other implementations/embodiments they might be located after those transmission lines but before the 2-to-1 combiner. The operation is similar to the circuit illustrated in FIG. 7 but additionally provides the additional ability to apply phase adjustment $\Delta\varphi_1$ and $\Delta\varphi_2$, respectively, to each of the signals in the transmission lines. This ensures, not only are the time slots aligned with the delay line provided in the Line 2, but are also aligned in phase. For instance, $\Delta\varphi_1$ typically will be 0 rad. and $\Delta\varphi_2$ will be the phase difference between the signals in the first and second paths determined according to Equation 4. The phase adjustment of $\Delta\varphi_1$ and/or $\Delta\varphi_2$ can also be used to correct for any drift or other discrepancies between the input and/or the output signals. One or more phase sensors (not shown) can be provided in the circuit to actively monitor the phases of the signals at various points in the circuit. A suitable controller (not shown) can receive the measured data from the phase sensor(s), and by applying a feedforward or feedback algorithm, for instance, control the phase adjustors so as to execute automatic phase correction.

Figure 9:
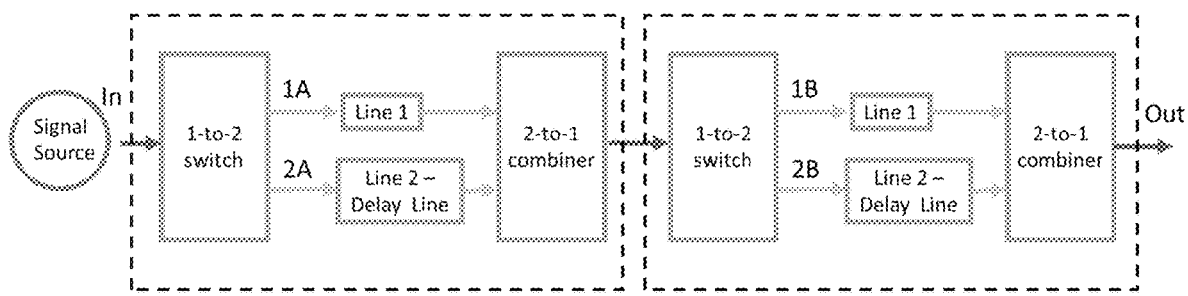
FIG. 9 shows a schematic of cascading time folding power combining circuits according to an embodiment.

Two of more time folding circuits can be combined for cascading time folding power combining circuitry to provide increase power. FIG. 9 shows a schematic of a cascading time folding power combining circuits according to an embodiment. It joins two folding power combining circuits in series with the output of a 2-to-1 combiner of a first-time folding circuit (in the dotted-line rectangle to the left) to the input of a 1-to-2 switch of a second time folding circuit (in the dotted-line rectangle to the right). The second-time folding circuit of the cascaded circuit converts a 50% duty cycle signal output from the first-time folding circuit to a 25% duty cycle and realize an additional boost to the peak power. Here, the result is a peak power output of ideally 4× the input signal.

In general, one can have multiple N-way time folding power combining circuits cascaded together in series. Thus, the cascaded embodiments can provide N signal lines for M time-folding circuits. The result is a peak power output of $M \times N \times P_{avg}$ of the input signal. This cascading power combining has the potential to lower the overall power consumption of pulsed RF systems by facilitating the use of power amplifiers with relatively small CW output power to produce a high peak power signal. This can lead to a significant cost saving and heat dissipation reduction.

The aforementioned circuits have largely shown two added signals. In accordance with other circuit embodiments, the components enable N signals to add.

Figure 10:
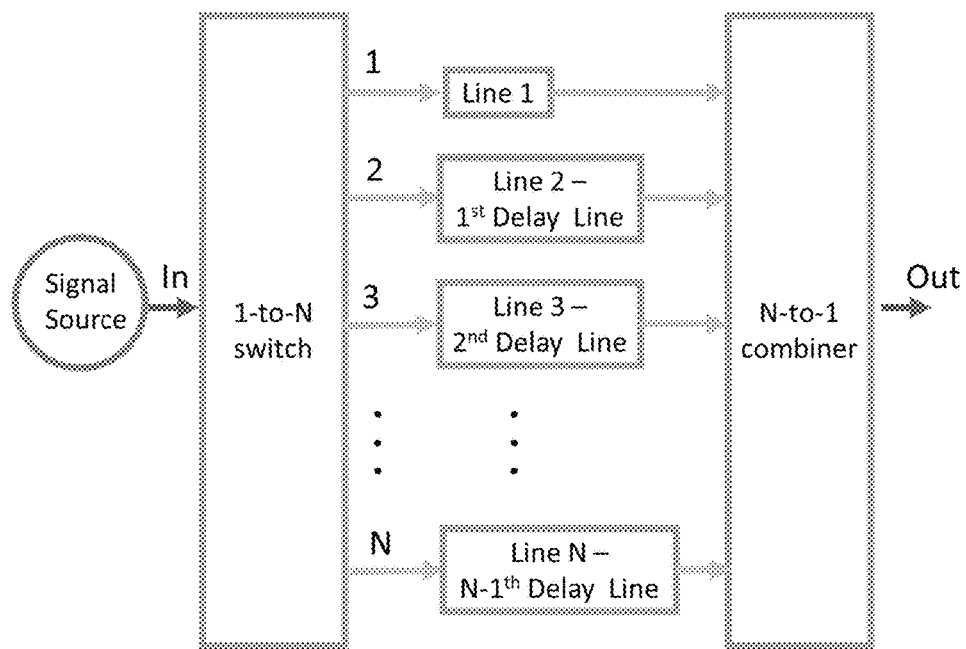
FIG. 10 is a schematic for a time folding power combining circuit for splitting and adding pulsed signals in N signal paths according to an embodiment.

FIG. 10 is a schematic for a time folding power combining circuit for adding N signals according to an embodiment. N is an integer of two or more. If N=2, the circuit simplifies to the circuit in FIG. 7. If N=3, the circuit simplifies to the one in FIG. 11. For N>3, the circuit may also be referred to as an N-way time folding power combining circuit as opposed to the 2-way time folding power combining circuit illustrated in FIG. 7.

The circuit is comprised of (i) a 1-to-N switch for 1 input and N outputs, (ii) a short transmission line in path 1; (iii) multiple (N−1) longer transmission lines (or delay lines) for aligning time/phase in the other paths, and (iv) a N-to-1 combiner for N inputs and 1 output.

Both 1-to-N switches and N-to-1 signal combiners are commercially-available components. The 1-to-N switch operates similar to a 1-to-2 SPDT switch. It can likewise be controlled with a square wave control signal $V_{cont}$. With each pulse (high value) of that square wave, the switch connects to the next signal line, in sequence, and then goes back to the first signal line. This time folding circuit converts a CW signal to a pulsed one and boosts the peak power. By using the N−1 delays, one can add a greater number of copies of the signal on top of each other and produce a higher peak amplitude. In some implementations/embodiments, a phase shifter may be included in the signal paths similar to as shown in FIG. 8 and described above so as to align the phases of respective signals in the paths.

As a result, the output of the N-to-1 combiner will be a pulse with duty cycle 1/N and peak power equal to $N \times P_{avg}$, assuming all components are lossless. Of course, in reality, the greater N is, the more lossy and complicated the circuit may become. This circuit is useful in applications where pulsed signals are sought; for example, in radar applications.

Figure 11:
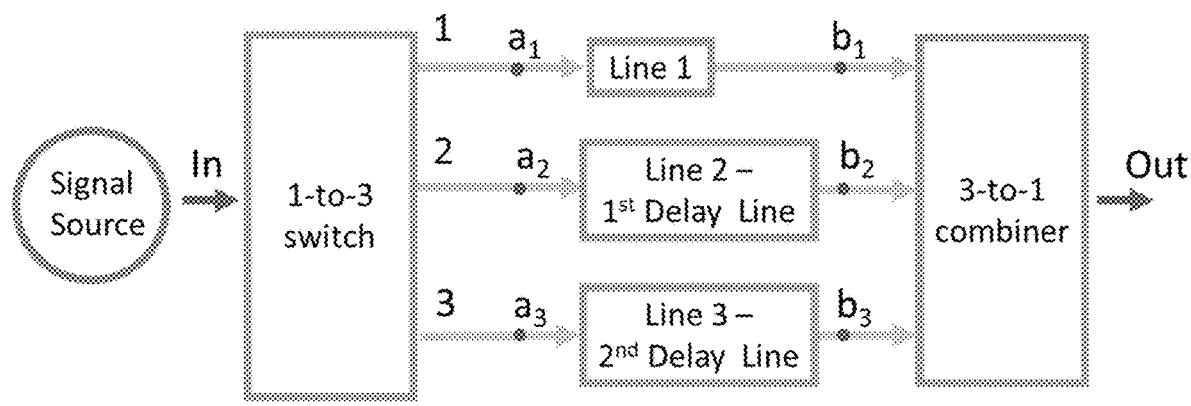
FIG. 11 show a schematic and operation for a time folding power combining circuit for splitting and adding pulsed signals in three signal paths according to an embodiment.

FIG. 11 shows a schematic and operation for a time folding power combining circuit for splitting and adding pulsed signals in three signal paths according to an embodiment. Its operations will be explained with further reference to the time folding power combining methodology shown in more detail in FIGS. 12A-12G.

Figure 12A:
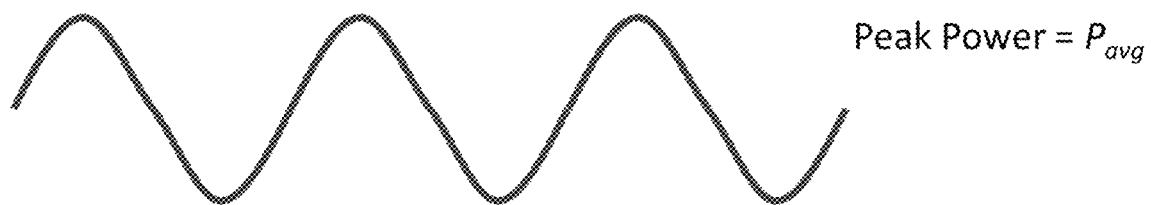
FIGS. 12A-12G show a method of time folding power combining according to an embodiment using the circuit in FIG. 11.

An exemplary signal from the signal source in FIG. 11 is depicted in FIG. 12A. It is shown as a continuous wave (CW) sinusoidal signal, but any repeating periodic electrical signal can be used. It has an amplitude, and a frequency, with a peak power of $P_{avg}$ related to its amplitude. Here, three periods of the CW sinusoidal signal are depicted for discussion (although, the signal is much longer in actuality).

The signal enters at node "In" in FIG. 11, where it gets switched between signal paths 1, 2, and 3 by the 1-to-3 switch. The 1-to-3 switch has three positions—i.e., a first position that connects the input to path 1, a second position that connects the input to path 2, and a third position that connects the input to path 3. It switches from position 1, to position 2, to position 3, and then back to position 1 and repeats this way, again and again. A control means can be used for switching similar to the one used in FIG. 1. The 1-to-3 switch thus divides the original CW signal into three pulsed signals in paths 1, 2, and 3 in a plurality of time slots. Here, each time slot is set to correspond to one period of the original CW signal. The duration of the time slots are controlled by how long the switch is held at a certain position. Of course, based on the duty cycle of the switching, the time slots may be multiple periods of the signal (such as shown in FIG. 2).

Figure 12B:
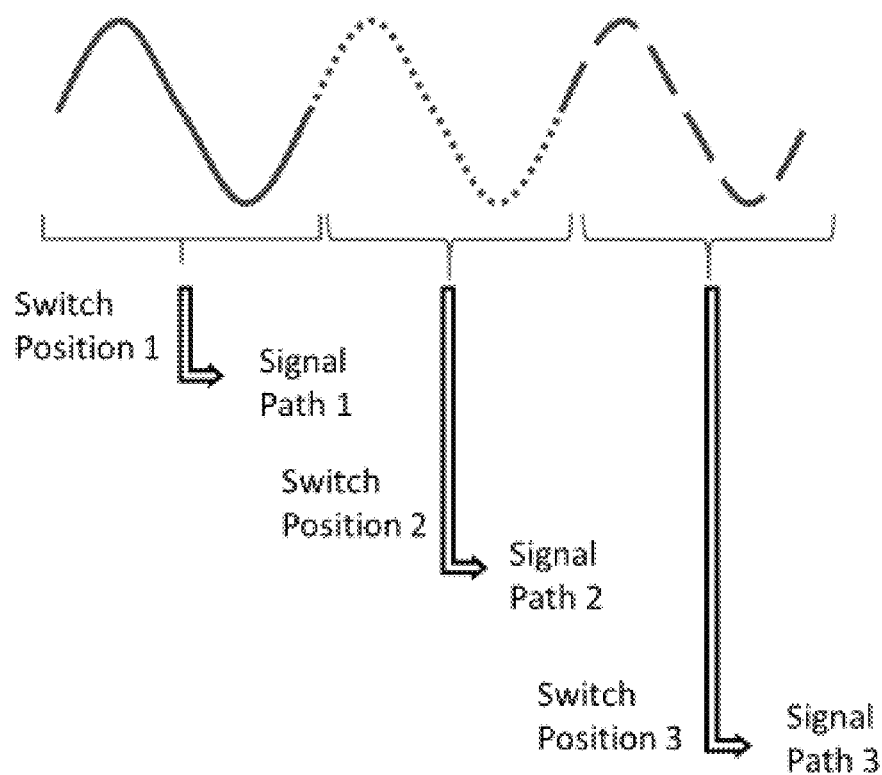

The switching is shown in FIG. 12B. The first period of the original signal (depicted in solid-line) is switched to first signal path 1 when the 1-to-3 switch is in position 1. The second period (depicted as the small-dotted line) is switched to second signal path 2 when the 1-to-3 switch is in position 2. And the third period of the original signal (depicted as the large-dotted line) is switch to the third signal path 3 when the 1-to-3 switch is in position 3. The switching process repeats again and again. The same line identifications (solid, small-dotted, large-dotted) of switched portions of the original signal will continue for aiding in the understanding the operation of the circuit in FIG. 11.

Figure 12C:
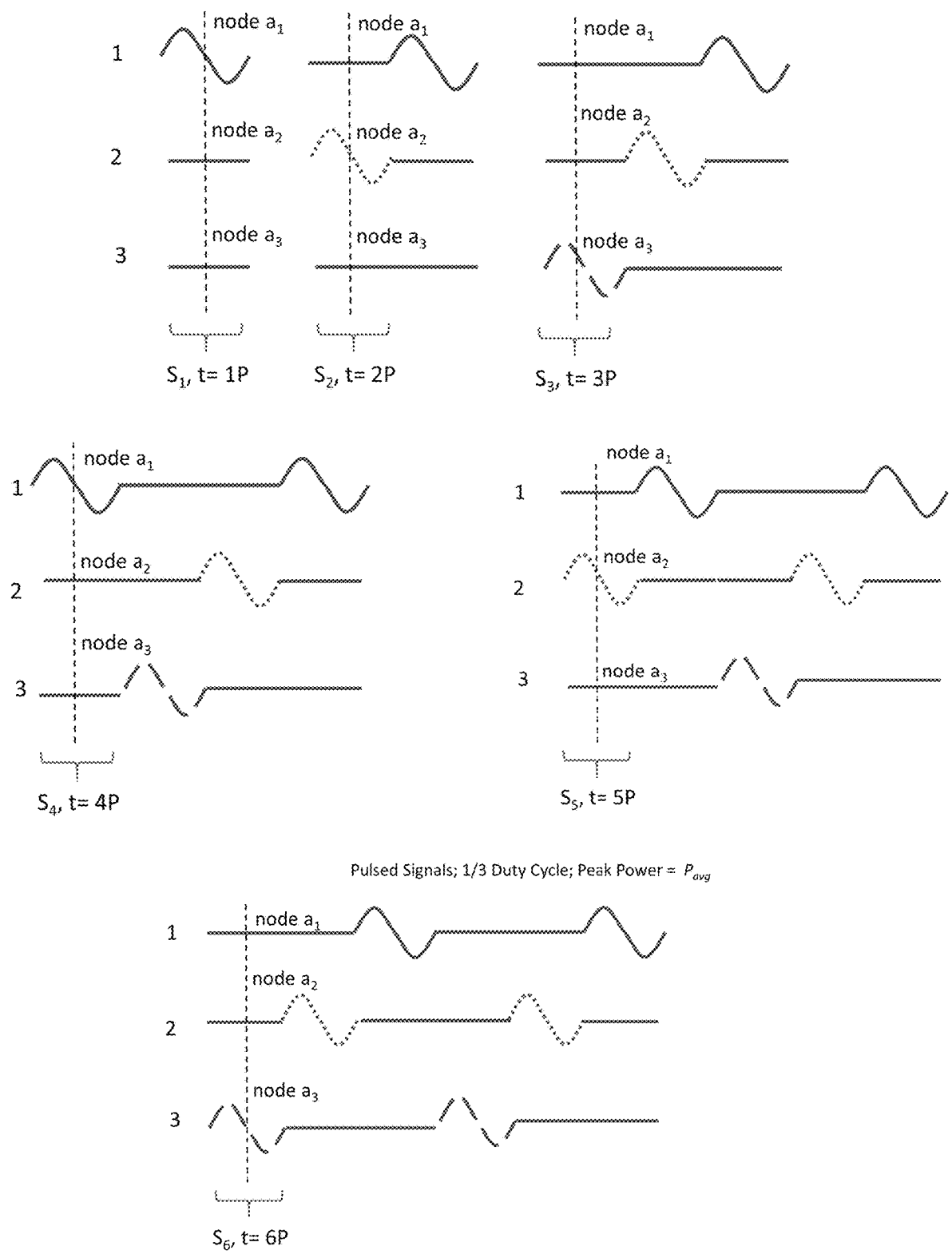

The switching results in a plurality of pulsed signals being formed in the signal paths as further shown in FIG. 12C over the various time slots. The sub-figures of FIG. 12C show the pulsed signals formed through the aforementioned switching as they pass nodes $a_1$, $a_2$, and $a_3$ in signal paths 1, 2, and 3 in the FIG. 11. The vertical dotted line represents the location of those nodes in the signal lines of the circuit as further labelled there. Time slots $S_1$ to $S_6$ have been shown in the sub-figures. The pulsed signals may be considered as propagating along the paths in time to the right in the sub-figures.

In the first time slot $S_1$, as pulse of the signal along signal path 1 passes node $a_1$, there are no significant signals at nodes $a_2$, and $a_3$, respectively, in signal paths 2 and 3. Those pulses are nil or zero at that time. In the second time slot $S_2$, as the pulse of the signal along path 2 passes node $a_2$, there are no significant signals at nodes $a_1$ and $a_3$. In the third time slot $S_3$, as the pulse of the signal along path 3 passes node $a_3$, there are no signals at node $a_1$, and $a_2$. As should be appreciated, the formation of the pulsed signals repeats again and again due to the continued switching. Thus, the pulsed signals in time slots $S_4$ to $S_6$ (and additional time slots $S_7$ to $S_9$, $S_{10}$ to $S_{12}$, $S_{13}$ to $S_{15}$, etc. (not shown)) are essentially the same as the earlier pulsed signals in $S_1$ to $S_3$ given the periodic nature of the original wave signal and the continuous, repeated switching.

By time slot $S_6$, it should be quite clear that the pulsed signals have a duty cycle of ⅓ and power peak of to $P_{avg}$. That is, for each of the pulsed signals in paths 1, 2, and 3, there is a portion which corresponds to the original signal for the time slots which the switch connects the input that signal path (for 1 period of the original signal), and a portion that is nil or zero for the time slots in which the switch does not connect the input to that signal path (for 2 periods).

Figure 12D:
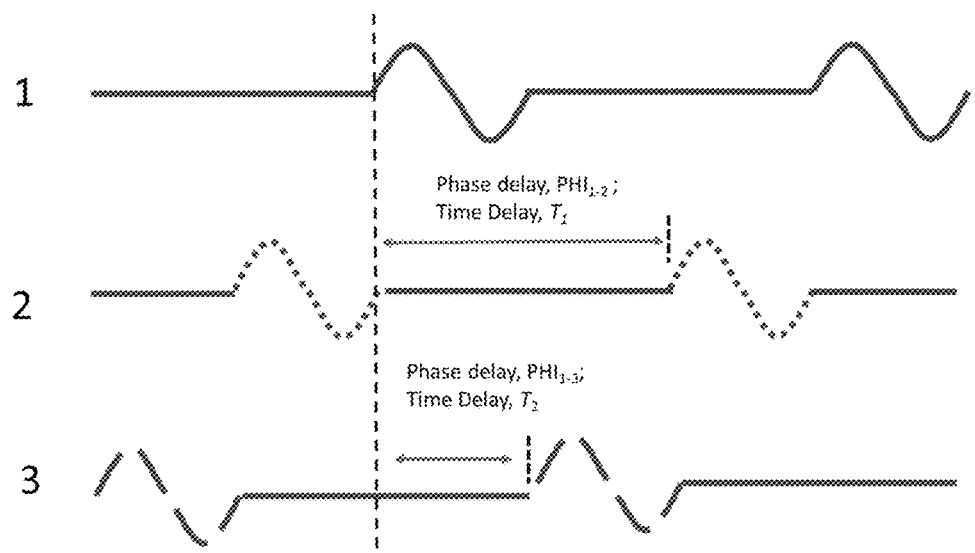

Moreover, it should be quite apparent that the signal along paths 1, 2, and 3 are not aligned in time. FIG. 12D shows the delay between pulsed signals in paths 2 and 3 compared to the pulsed signal in path 1. If the pulsed signal in path 2 can be delayed by a phase delay, $PHI_{1-2}$ then it will align with the time slots of the pulses in path 1. Similarly, if the pulsed signal in path 3 can be delayed by a phase delay, $PHI_{1-3}$ then it will align with the time slots of the pulses in path 1 too. Phase delays $PHI_{1-2}$ and $PHI_{1-3}$ correlated to a time delays of $T_1$ and $T_2$, respectively, according to equation (3a). Here, $PHI_{1-2}$ is equal to $4\pi$ rads and $T_1$ is equal to two periods of the original signal. And $PHI_{1-3}$ is equal to a rads and $T_2$ is equal to one period of the original signal. $PHI_{1-2}/T_1$ are larger than $PHI_{1-3}/T_2$ since signal pulses in path 2 were already delayed by a period from path 3 due to the switching.

Figure 12E:
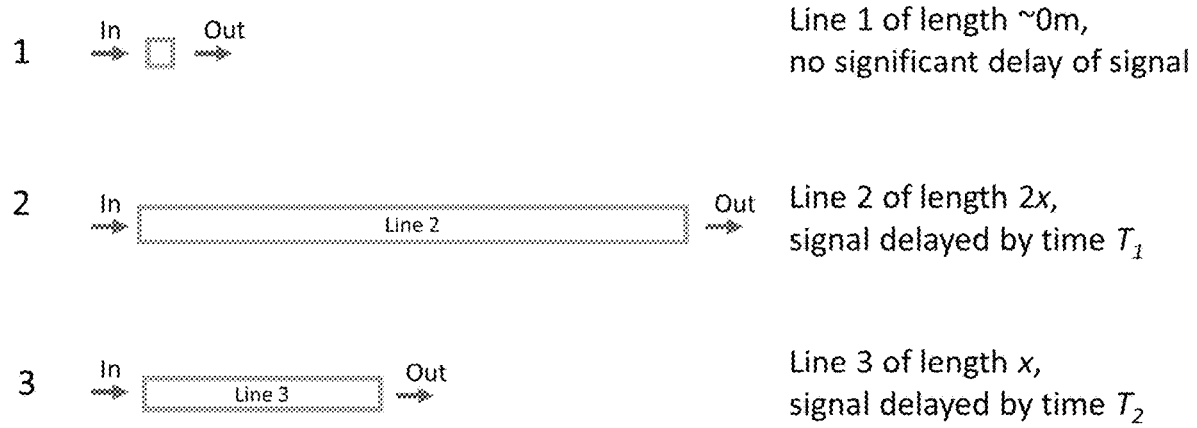

Line 1, Line 2 and Line 3 in FIG. 11 are transmission lines in the three signal paths. The transmission lines may comprise a significant part of the signal paths. An example of their configuration is shown in FIG. 12E. Line 1 introduces no delay to the signal in signal path 1. It is very short (e.g., ~0m). Line 2 and Line 3 are long lines so as to introduce a significant time delay in the signals passing through them. Line 2 is longer than Line 3 to introduce a greater time delay. More particularly, Line 2 is configured to delay the pulsed signal in path 2 by the time $T_1$ so that the pulsed signals in path 2 align in the time slots with the pulsed signals in path 1 prior to their combination in the 3-to-1 combiner. And, likewise, Line 3 is configured to delay the pulsed signal in path 3 by the time $T_2$ so that the pulsed signals in path 3 align in the time slots with the pulsed signals in paths 1 and path 2 prior to their combination in the 3-to-1 combiner. The lengths of Line 2 and Line 3 can be each be determined using Equation (4). The length Line 2 will be twice as long as Line 3 to provide twice as much delay. Thus, Line 3 is x in length and Line 2 is 2x in length to provide for time delays $T_1$ and $T_2$, respectively.

The figure shows the delay lines being linear in shape. It is not to scale. The delay lines may be standard coaxial cables as one non-limiting example. The inputs and outputs of the Line 1, Line 2 and Line 3, though, will need to be at or near the same locations, i.e., with their inputs being sufficiently close to connect to the switch and their outputs being sufficiently close to connect to the combiner. The respective ends of the signal lines may be soldered, screw or plug-in, or otherwise be electrically joined at or near the switch and combiners. So, it will be appreciated that the delay lines may be bent, spooled, coiled, bundled, wrapped, etc., one or more times, between its beginning and end, as may be necessary or otherwise practical for packaging and/or providing compactness. They may have U-shaped or V-shaped configuration, for instance. (FIG. 1 shows a bent U-shaped configuration for the delay line).

Figure 12F:
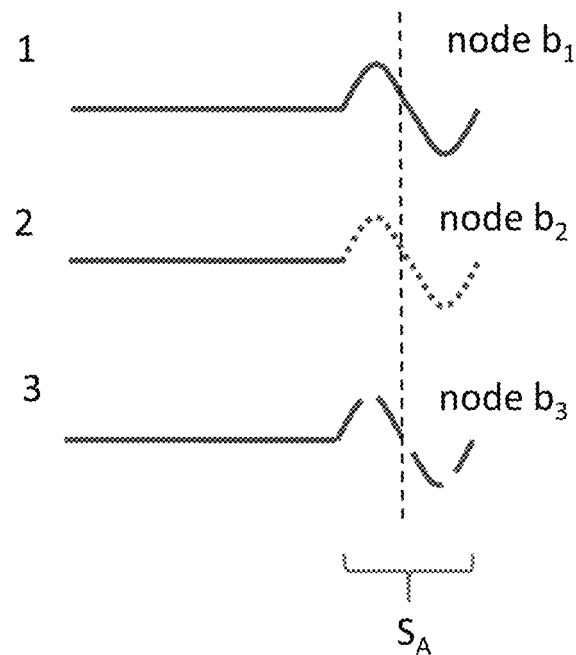

FIG. 12F shows the effect of the transmission lines on the pulsed signals in paths 1, 2, 3; it shows the pulsed signals as they pass nodes $b_1$, $b_2$, and $b_3$ located just before the 3-to-1 combiner in FIG. 11. The vertical dotted line represents the location of those nodes in the signal lines of the circuit as further labelled there. Pulsed signals in Line 1 which were not delayed propagate to node $b_1$ in due course in a time slot SA and subsequent time slots. During that same time, the pulsed signal in paths 2 and 3 are delayed by $T_1$, and $T_2$, respectively, going through the much longer Line 2 and Line 3. Thus, when those pulsed signals exit Line 2 and Line 3 at nodes $b_2$, and $b_3$, they are substantially aligned with the pulsed signals exiting Line 1 at node $b_1$ in the time slot SA. The aligned pulsed signals in the lines thus reach the 3-to-1 combiner at substantially the same time, i.e., in the same time slots.

In some implementations/embodiments, each path can also include a phase shifter/adjuster that may be used to provide additional phase adjustment of time signals similar to what was shown in FIG. 8. This can correct for any drift or other discrepancies between the input and/or the output signals which might occur.

Figure 12G:
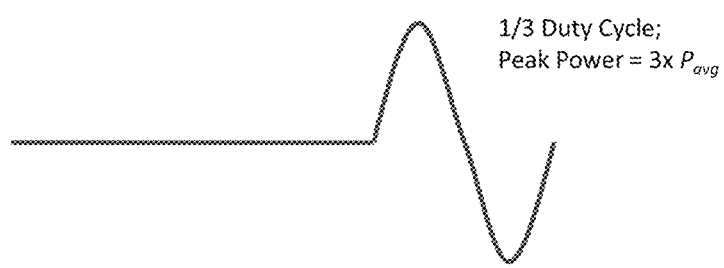

FIG. 12G shows the output of the 3-to-1 combiner in FIG. 11 at the node "Out". It is pulse with duty cycle ⅓ and peak power equal to $3\times P_{avg}$, assuming all components are lossless.

This technology allows for the use of a relatively small power component to produce a pulsed signal with a high amplitude. It can reduce the size, weight, and cost of power amplifiers in radars, as well as increase the peak power a factor of 2×, 3×, 4× or even higher.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present disclosure and its practical applications, and to describe the actual partial implementation in the laboratory of the system which was assembled using a combination of existing equipment and equipment that could be readily obtained by the inventors, to thereby enable others skilled in the art to best utilize the invention and various embodiments with various modifications as may be suited to the particular use contemplated.

While the foregoing is directed to embodiments of the present invention, other and further embodiments of the invention may be devised without departing from the basic scope thereof, and the scope thereof is determined by the claims that follow.

I claim:
1. A time folding power combining circuit comprising:
a switch which receives a continuous wave signal as an input, and outputs first and second pulsed wave signals along first and second signal paths, respectively, said switch being configured to repeatedly switch connection back and forth between the input and the outputs of the first and second signal paths in a plurality of time frames;
a delay line in the second signal path configured to introduce a time delay to the second pulsed wave signal in the second signal path such that the first pulsed wave signal in the first signal path and the time-delayed second pulsed wave signal in the second signal path substantially align in the same time frames; and a combiner, which receives the first pulsed wave signal in the first signal path and the time-delayed pulsed second wave signal in the second signal path as inputs, and combines them into a single combined pulsed wave signal as an output.

2. The circuit of claim 1, further comprising a phase adjuster provided in one or more of the signal paths to adjust the phase of the first pulsed wave signal and/or the time-delayed second pulsed wave signal.

3. The circuit of claim 1, wherein the switch comprises a single pole double throw (SPDT) switch.

4. The circuit of claim 1, wherein the switch receives a control signal for causing it to switch the connection back and forth.

5. The circuit of claim 4, further comprising a control signal generator configured to generate the control signal.

6. The circuit of claim 4, wherein the control signal is a square wave signal.

7. The circuit of claim 4, wherein the control signal has a frequency between 10-1,000 MHz.

8. The circuit of claim 1, further comprising: a continuous wave generator configured to produce the continuous wave signal.

9. The circuit of claim 1, wherein the continuous wave signal has a frequency between 1-10,000 MHz.

10. The circuit of claim 1, wherein the peak power of the single combined pulsed wave signal output is approximately twice that of the continuous wave signal input.

11. A time folding power combining circuit comprising:
a 1-to-N switch which receives a continuous wave signal as its input, and outputs N pulsed wave signals along a first signal path and N−1 signal paths, respectively, said switch being configured to repeatedly switch connection back and forth between the input and the output of the first signal paths and the N−1 signal paths in a plurality of time frames;
a plurality of delay lines, wherein one delay line is provided in each of the N−1 signal paths configured to introduce a time delay to pulsed wave signals in the given N−1 signal paths such that the first pulsed wave signal in the first signal path and each of the N−1 time-delayed pulsed wave signals in the N−1 signal paths substantially align in the same time frames; and
an N-to-1 combiner, which receives the first pulsed wave signal in the first signal path and the N−1 time-delayed pulsed wave signals in the N−1 signal paths as inputs, and combines them into a single combined pulsed wave signal as an output.

12. The circuit of claim 11, where N is an integer greater than or equal to 2.

13. The circuit of claim 11, where the delay lines in the N−1 signal paths sequentially add a lesser amount of time delay to the pulsed signals in those lines.

14. The circuit of claim 11, wherein the delay lines comprise coaxial cables.

15. The circuit of claim 11, wherein each delay line in the N−1 signal paths is bent, spooled, coiled, bundled, and/or wrapped, one or more times, between its beginning and end.

16. The circuit of claim 11, further comprises a phase adjuster provide in one or more of the signal paths to adjust the phase of the first pulsed wave signal and/or the N−1 time-delayed pulsed wave signals.

17. The circuit of claim 11, further comprising a signal source which generates the continuous wave signal.

18. The circuit of claim 11, wherein the peak power of the single combined pulsed wave signal output is approximately N times that of the continuous wave signal input.

19. A cascading circuit of time folding power combining circuits comprising:
at least a first-time folding power combining circuit and second-time folding power combining circuit, each according to claim 11, connected in series with the output of the first time folding power combining circuit being the input to the second time folding power combining circuit.

20. The cascading circuit of claim 19, wherein the peak power of the single combined pulsed wave signal output is approximately M×N times that of the continuous wave signal input, wherein M is the number of cascaded time folding power combining circuits and N is the number of lines of each time folding power combining circuit.

* * * * *